United States Patent
Inoue et al.

(10) Patent No.: US 6,917,091 B2
(45) Date of Patent: Jul. 12, 2005

(54) HIGH POWER SEMICONDUCTOR DEVICE HAVING SOURCE ELECTRODES CONNECTED BY AIR BRIDGES AND HAVING OPPOSITE CURRENT PATH DIRECTIONS

(75) Inventors: Akira Inoue, Tokyo (JP); Seiki Gotou, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/770,414

(22) Filed: Feb. 4, 2004

(65) Prior Publication Data

US 2004/0188758 A1 Sep. 30, 2004

(30) Foreign Application Priority Data

Mar. 28, 2003 (JP) ........................................ 2003-090283

(51) Int. Cl.⁷ .............................................. H01L 29/00
(52) U.S. Cl. ....................................................... 257/502
(58) Field of Search ......................... 257/502, 335–340; 307/23.4, 242

(56) References Cited

U.S. PATENT DOCUMENTS

| | | | |
|---|---|---|---|
| 4,931,844 A | * | 6/1990 | Zommer ...................... 257/48 |
| 5,742,091 A | | 4/1998 | Hebert |
| 5,844,299 A | | 12/1998 | Merrill et al. |
| 5,883,407 A | | 3/1999 | Kunii et al. |
| 6,046,641 A | * | 4/2000 | Chawla et al. |
| 6,180,995 B1 | | 1/2001 | Hebert |
| 6,221,727 B1 | | 4/2001 | Chan et al. |
| 6,303,950 B1 | | 10/2001 | Kurusu et al. |
| 6,307,247 B1 | | 10/2001 | Davies |
| 6,661,068 B2 | | 12/2003 | Durham et al. |
| 2003/0146490 A1 | | 8/2003 | Averett et al. |

OTHER PUBLICATIONS

Ito et al, "Performance Improvement in Larger RF LDMOS-FET Power Amplifiers".

* cited by examiner

Primary Examiner—Fetsum Abraham
(74) Attorney, Agent, or Firm—Leydig, Voit & Mayer, Ltd.

(57) ABSTRACT

A high power semiconductor device including gate electrodes also includes an active region of an approximately rectangular shape, located on a semiconductor substrate; a drain electrode located on the active region; and first and second source electrodes which are disposed on opposite sides to the drain electrode so that the first and second source electrodes face each other across at least some of the gate electrodes. The directions of currents carried by the first and second source electrodes are opposite to each other.

17 Claims, 8 Drawing Sheets

HIGH POWER SEMICONDUCTOR DEVICE HAVING SOURCE ELECTRODES CONNECTED BY AIR BRIDGES AND HAVING OPPOSITE CURRENT PATH DIRECTIONS

CROSS-REFERENCE TO RELATED APPLICATION

The present application claims the benefit of patent application No. 2003-90283 filed in Japan on Mar. 28, 2003, the subject matter of which is hereby incorporated herein by reference.

BACKGROUND OF THE INVENTION

1. Field of the Invention

The present invention relates to a high-frequency, high power semiconductor device, and more particularly, to a semiconductor device which is used in a high-frequency to range of 800 MHz or higher.

2. Description of the Related Art

A high power FET has generally a structure in which FET cells, each formed by one set of a gate electrode, a drain electrode and a source electrode, are arranged parallel to each other. When an electrode width Wgu is made wider and the number of FET cells is increased to thereby extend an overall gate width Wgt, a high power output is obtained.

However, widening of the electrode width Wgu gives rise to a problem that a source inductance Ls increases and a maximum gain of the FET becomes small. While an alternative to this is to connect a plurality of FETs by an external synthesis circuit without increasing the number of FET cells included in the FETs to thereby obtain a high power output while preventing a drop in FETs' maximum gain, when a synthesis circuit is externally disposed, a problem of increased costs arises.

There is another problem that since all gate electrodes are connected with one or more gate wires in a high power FET, the circuit can not be stabilized in the units of cells or cell blocks which are groups of cells and the FET oscillates in an internal loop.

SUMMARY OF THE INVENTION

The present invention aims at providing a high power FET in which the electrode width Wgu is extended and/or the number of FET cells contained in the FET is increased without decreasing the FET's maximum gain.

The present invention is directed to a high power semiconductor device in which there are a plurality of gate electrodes. The device includes an active region of an approximately rectangular shape which is formed on a semiconductor substrate; a drain electrode which is formed on the active region; and a first and a second source electrodes which are disposed on the both sides to the drain electrode in such a manner that the first and the second source electrodes face each other across the gate electrodes. The directions of currents carried by the first and the second source electrodes are opposite to each other.

The present invention is directed also to a high power semiconductor device in which there are a plurality of source electrodes. The device includes an active region of an approximately rectangular shape which is formed on a semiconductor substrate; a plurality of source electrodes which are formed on the active region; a drain electrode which is disposed such that the drain electrode faces the source electrodes across a gate electrode; and a bridge wire which is disposed above the source electrodes and. connects the source electrodes with each other. The source electrodes are connected with each other by the bridge wire so that the directions of currents carried by the source electrodes are alternately opposite to each other.

As clearly described above, the semiconductor devices according to the present invention yield a high power output without decreasing a maximum gain.

DETAILED DESCRIPTION OF THE PREFERRED EMBODIMENTS

Preferred Embodiment 1

Figure 1:
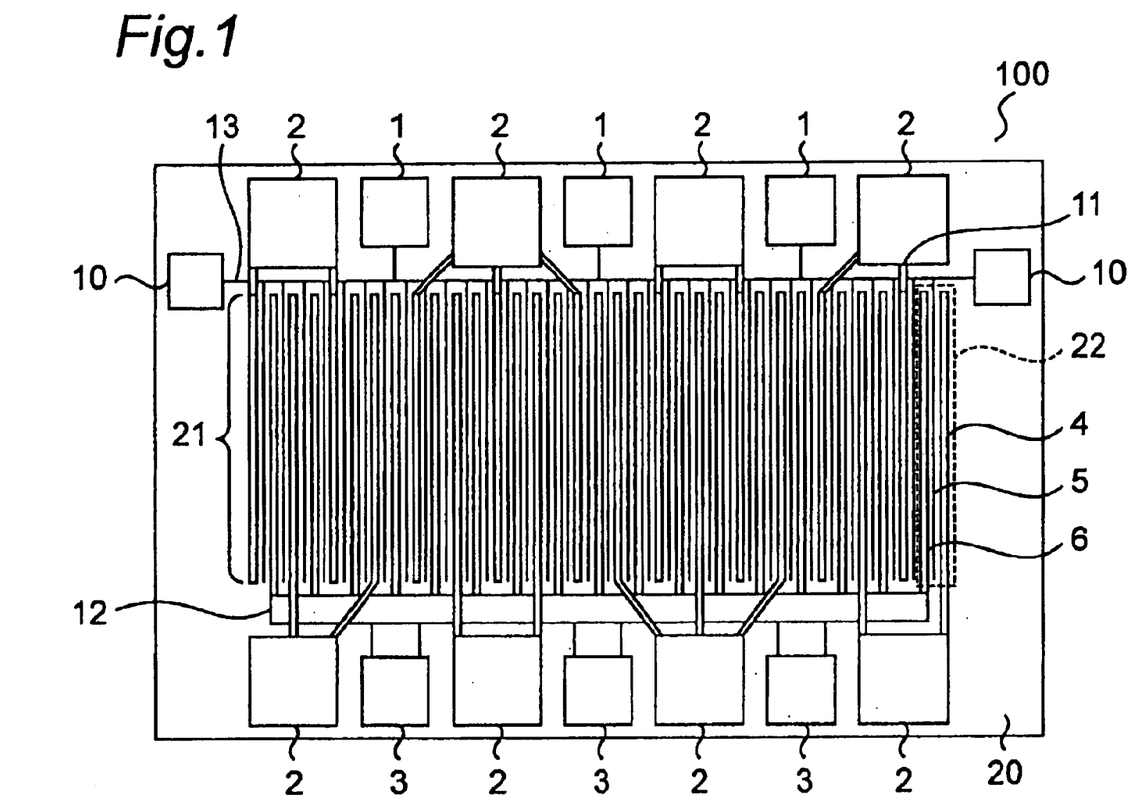
FIG. 1 is a top view of the semiconductor device according to the preferred embodiment 1 of the present invention.

FIG. 1 is a top view of a semiconductor device according to a preferred embodiment 1, which is generally denoted at 100. The semiconductor device 100 is a high power FET for use in mobile telecommunications, and used in a frequency range of mainly 0.8 GHz through 2.4 GHz.

The semiconductor device 100 includes a semiconductor substrate 20 of Si, GaAs or the like. An active region 21 is disposed in the semiconductor substrate 20. Disposed on one side to the active region 21 are gate pads 1 and source via holes 2, and disposed on the other side to the active region 21 are drain pads 3 and source via holes 2.

On the active region 21, there are a plurality of cells 22, in which a source electrode 4 and a drain electrode 6 face each other across a gate electrode 5, are arranged approximately parallel to each other. One cell 22 is formed by one set of the source electrode 4, the gate electrode 5 and the drain electrode 6. Adjacent cells 22 share the source electrode 4 or the drain electrode 6.

The source electrodes 4 are connected with the source via holes 2 via source air bridges 11. The source via holes 2 are connected with source electrodes (not shown) disposed on the back surface through the substrate 20. The source electrodes are normally grounded.

Further, the gate electrodes 5 are connected with a gate wire 13 and further with external connection pads 10. The external connection pads 10 are used for connection with gate electrodes or the like of other chip by wire bonding or for stabilization by means of connection with an external RC series circuit in an effort to prevent oscillation.

As source pads 1 and drain pads 3 are connected with an external circuit by bonding wires in the semiconductor device 100, the semiconductor device 100 can be used as an amplifier for instance.

The electrode width Wgu of the source electrodes 4, the gate electrodes 5 and the drain electrodes 6 (which is the length along the vertical direction in FIG. 1) is from about 0.5 mm to about 1.2 mm, the electrode length of the source electrodes 4 and drain electrodes 3 (which is the length along the horizontal direction in FIG. 1) is about 10 $\mu$m, and the electrode length of the gate electrodes 5 is from about 0.1 $\mu$m to about 1 $\mu$m. The horizontal width (the width of the shorter sides) of the cells 22 formed by the source electrodes 4, the gate electrodes 5 and the drain electrodes 6 is about 40 $\mu$m.

In the semiconductor device 100, the source via holes 2 are provided on the both sides to the active region 21, and the source electrodes 4 disposed in a parallel arrangement within the active region 21 are connected alternately with the source via holes 2 which are disposed on the opposite side across the active region 21.

The directions of currents flowing from the source electrodes 4 which are formed in the active region 21 to the source via holes 2 therefore are alternately opposite to each other. This corresponds to alternately reversing the sign of mutual inductances Ls between the source electrodes 4.

Figure 2:
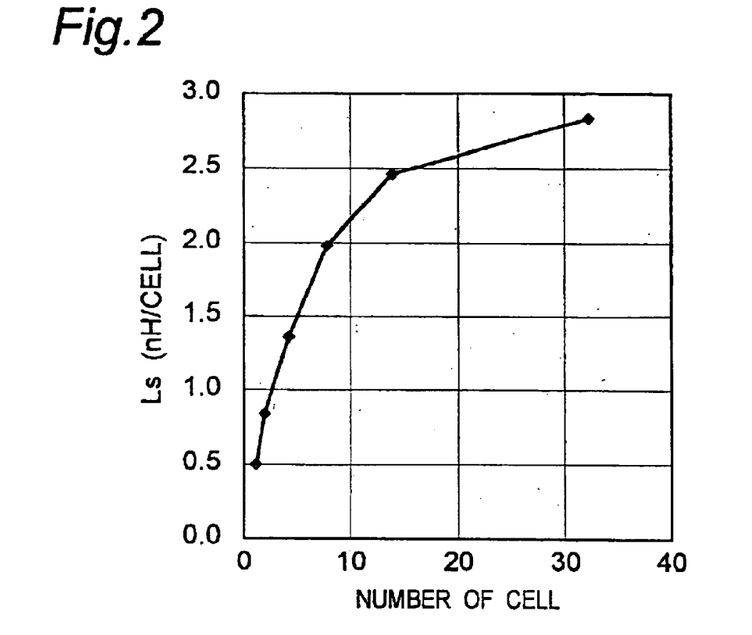
FIG. 2 shows a result of the calculation conducted on a relationship between the number of the cells which are included in the semiconductor device and the source inductance Ls per cell.

FIG. 2 shows a result of calculation conducted on a relationship between the number of cells which are included in a conventional semiconductor device and a source inductance Ls per cell, calculated as for Wgu=1.2 mm. A wire model was used for the calculation, and the calculation was made considering mutual inductances between the respective wires.

In short, where the symbol d denotes a distance between a cell i and a cell j which are two mutually. adjacent cells and the symbol L denotes the length of the wires, a mutual inductance Lij of the cell i relative to the cell j is expressed by the following equation 1:

$$Lij=(1/2\pi)\cdot\mu_o\cdot[L\cdot 1n(L+\sqrt{(L^2+d^2)}/d])-\sqrt{(L^2+d^2)}+d]$$ (Equation 1)

In the event that a plurality of cells are synthesized, a voltage Vj of an FET forming the cell j is expressed by the following equation 2:

$$Vj=Ljj\cdot Ij+\Sigma Lji\cdot Ii$$ (Equation 2)

where the symbol Ij denotes a current.

Assuming as first-order approximation that Ij remains the same throughout all cells, each cell's inductance L(j) is expressed by the following equation 3:

$$L(j)=Ljj+\Sigma Lji$$ (Equation 3)

It is seen in FIG. 2 that an increase in the number of the cells greatly increases the source inductance Ls of the semiconductor device which includes these cells. An increase of the source inductance Ls leads to a reduction in maximum gain, thereby consequently deteriorating characteristics of the semiconductor device.

Figure 3:
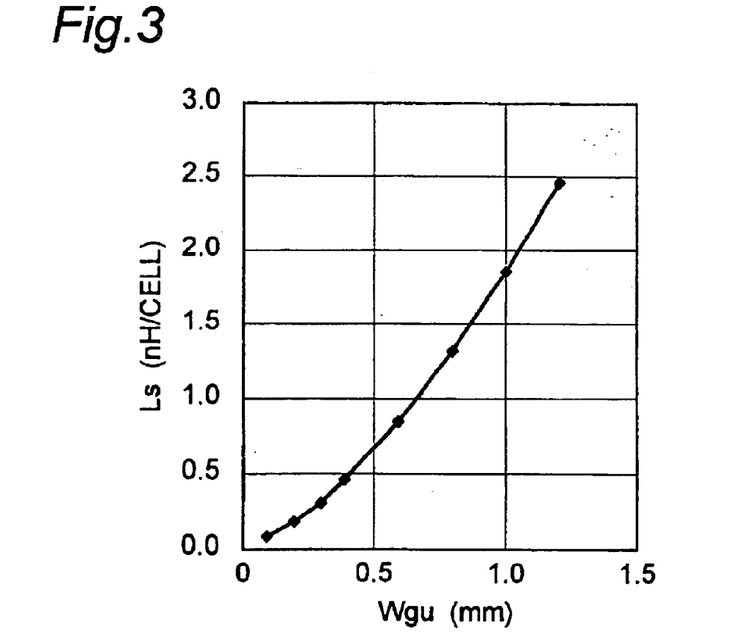
FIG. 3 shows a result of the calculation conducted on Wgu of the semiconductor device and the source inductance Ls per cell.

Meanwhile, FIG. 3 shows a result of calculation conducted on the dependence of the source inductance Ls upon Wgu within the semiconductor device. Measured along the horizontal axis is Wgu and measured along the vertical axis is the source inductance Ls. It is seen in FIG. 3 that when the electrode width Wgu increases, the source inductance Ls increases remarkably. As mentioned above, an increase of the source inductance Ls leads to a reduction in maximum gain, thereby consequently deteriorating the characteristics of the semiconductor device.

While a first approach to obtain a high power output may be means which increases the number of cells and a second approach may be means which increases the electrode width Wgu as described above, any means reduces the maximum gain.

Figure 4:
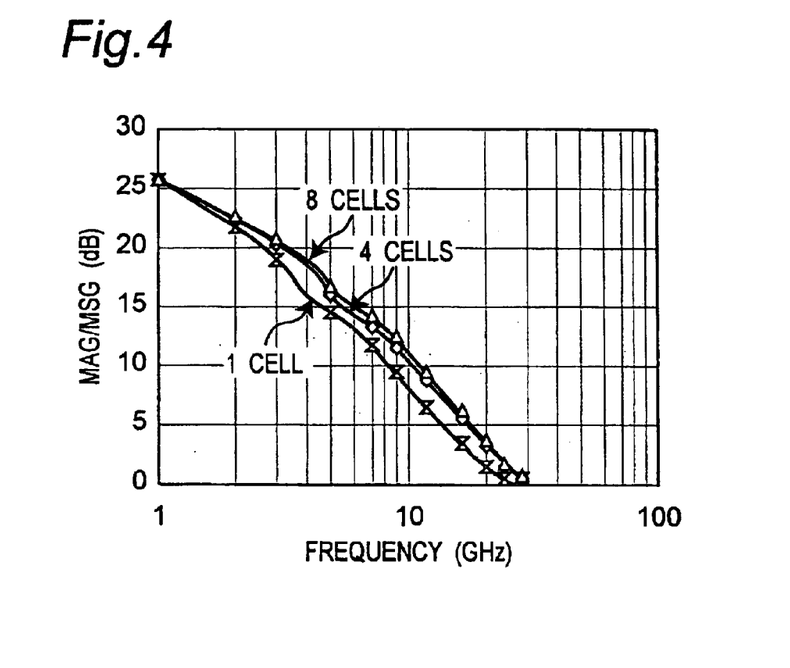
FIG. 4 shows a relationship between the number of the cells included in the semiconductor device according to the preferred embodiment 1 of the present invention and the maximum gain.
Figure 5:
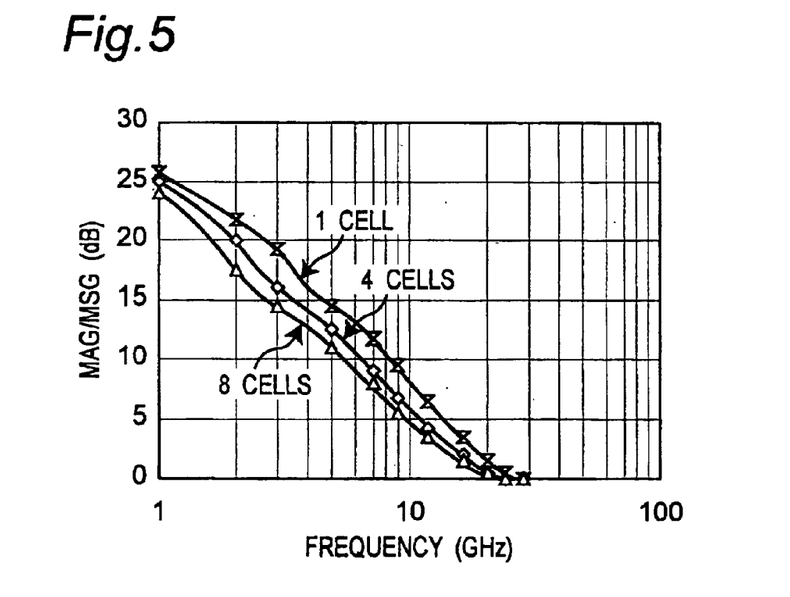
FIG. 5 shows a relationship between the number of cells included in a conventional semiconductor device and the maximum gain.

FIG. 4 shows a relationship between the number of cells which are included in the semiconductor device 100 according to the preferred embodiment 1, in which the directions of currents flowing from the source electrodes 4 to the source via holes 2 are alternately opposite to each other, and the maximum gain. Meanwhile, FIG. 5 shows a relationship between the number of cells which are included in such a conventional semiconductor device, in which the directions of currents flowing from source electrodes to source via holes are constant, and the maximum gain. In FIGS. 4 and 5, the horizontal axis denotes the frequency of the semiconductor device 100 and the vertical axis denotes the maximum gain (MAG/MSG).

In FIG. 4, as the number of the cells which are included in the semiconductor device increases from 1 to 4 and further to 8, the maximum gain increases. On the contrary, in the conventional semiconductor device shown in FIG. 5, as the number of the cells increases from 1 to 4 and further to 8, the maximum gain decreases.

In the case of the semiconductor device 100 according to the preferred embodiment 1, as the directions of currents carried by the source electrodes 4 are alternately opposite to each other, mutual inductances developing at the source electrodes 4 are offset. Hence, even when the number of the cells is increased, the source inductance Ls of the semiconductor device 100 as a whole decreases, and therefore, it is possible to increase an electric output of the semiconductor device 100 without decreasing the maximum gain.

Further, in the semiconductor device 100, since mutual inductances developing at the source electrodes 4 are offset each other as mentioned above, even when the electrode width Wgu is increased, the maximum gain of the semiconductor device 100 does not decrease. Hence, it is possible to increase an electric output of the semiconductor device 100 without decreasing the maximum gain.

In the manner described above, in the semiconductor device 100 according to the preferred embodiment 1, as the number of the cells which are included in the semiconductor device 100 is increased or as the electrode width Wgu is increased, it is possible to increase an electric output of the semiconductor device 100 without decreasing the maximum gain. Since it is possible to obtain a high power output without disposing a synthesis circuit outside the semiconductor device 100, it is possible to reduce costs.

While the preferred embodiment 1 is directed to an FET, other transistor such as an HBT may be used instead of an FET. In addition, the number of the electrodes connected with the pads is not limited to that according to the preferred embodiment 1.

Figure 6:
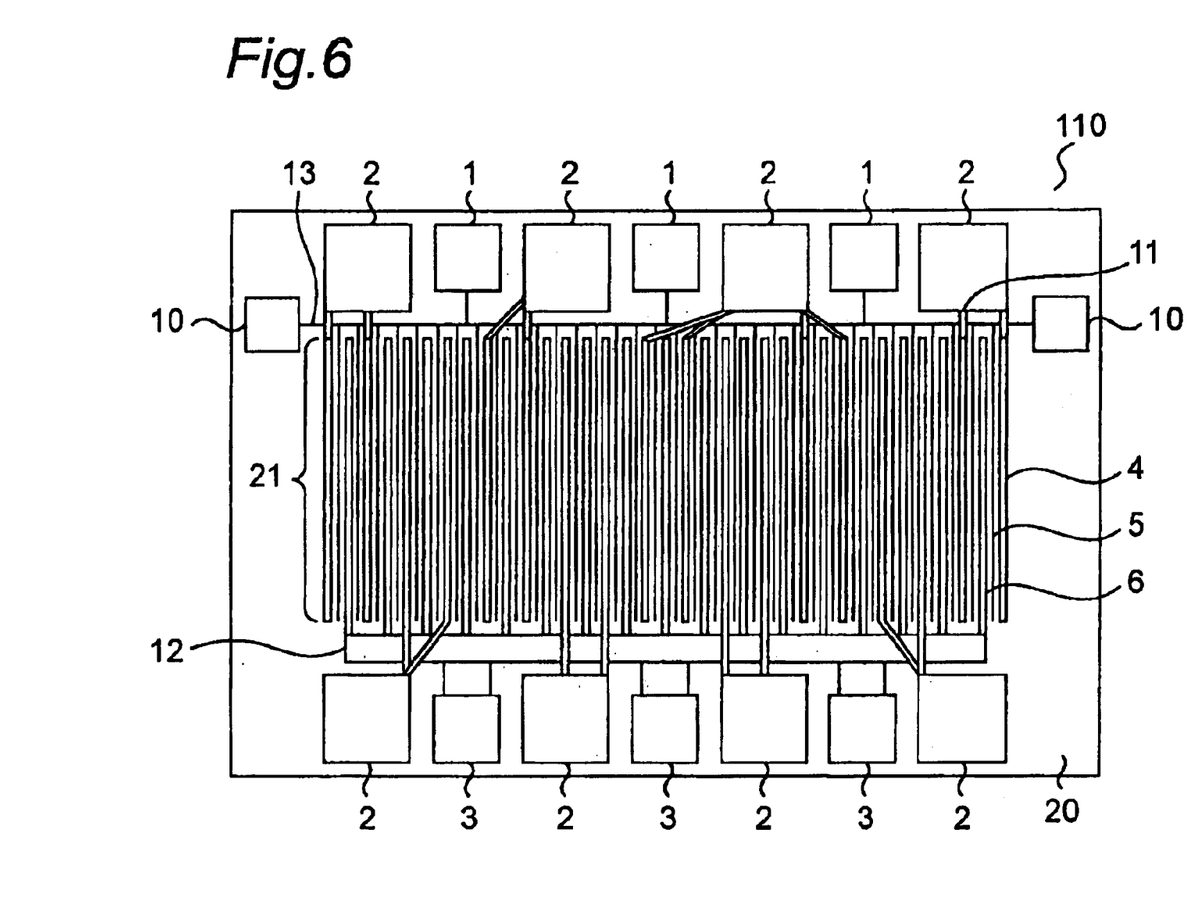
FIG. 6 is a top view of another semiconductor device according to the preferred embodiment 1 of the present invention.

FIG. 6 is a top view of other semiconductor device according to the preferred embodiment 1, which is generally denoted at 110. In FIG. 6, the same reference symbols as those in FIG. 1 denote the same or corresponding portions.

In the semiconductor device 110, a plurality of source electrodes 4 formed on an active region 21 are connected alternately with each one of source via holes 2 which are formed above the active region 21 and source via holes 2 which are formed below the active region 21. Hence, the directions of every two currents flowing from the source electrodes 4 to the source via holes 2 are alternately opposite to each other. In this structure as well, mutual inductances developing at the source electrodes 4 are offset and the source inductance Ls of the semiconductor device 110 is reduced.

As long as mutual inductances are offset by each other, the directions of every three or more currents carried by the source electrodes 4 may be changed. Further, the number of the source electrodes 4 connected with the source via holes 2 may be changed.

In the semiconductor device 110 in particular, the horizontal-direction space (horizontal width) of the source electrodes connected with one source via hole 2 is equal to or narrower than the horizontal width of the source via hole 2. Hence, as compared with a semiconductor device described in JP, 10-233404, A, distances between the source electrodes which carry currents of the opposite directions are shorter and the effect of offsetting mutual inductances between these the source electrodes enhances. This reduces the source inductance Ls of the semiconductor device 110 even more, and increases the maximum gain even further.

Preferred Embodiment 2

Figure 7:
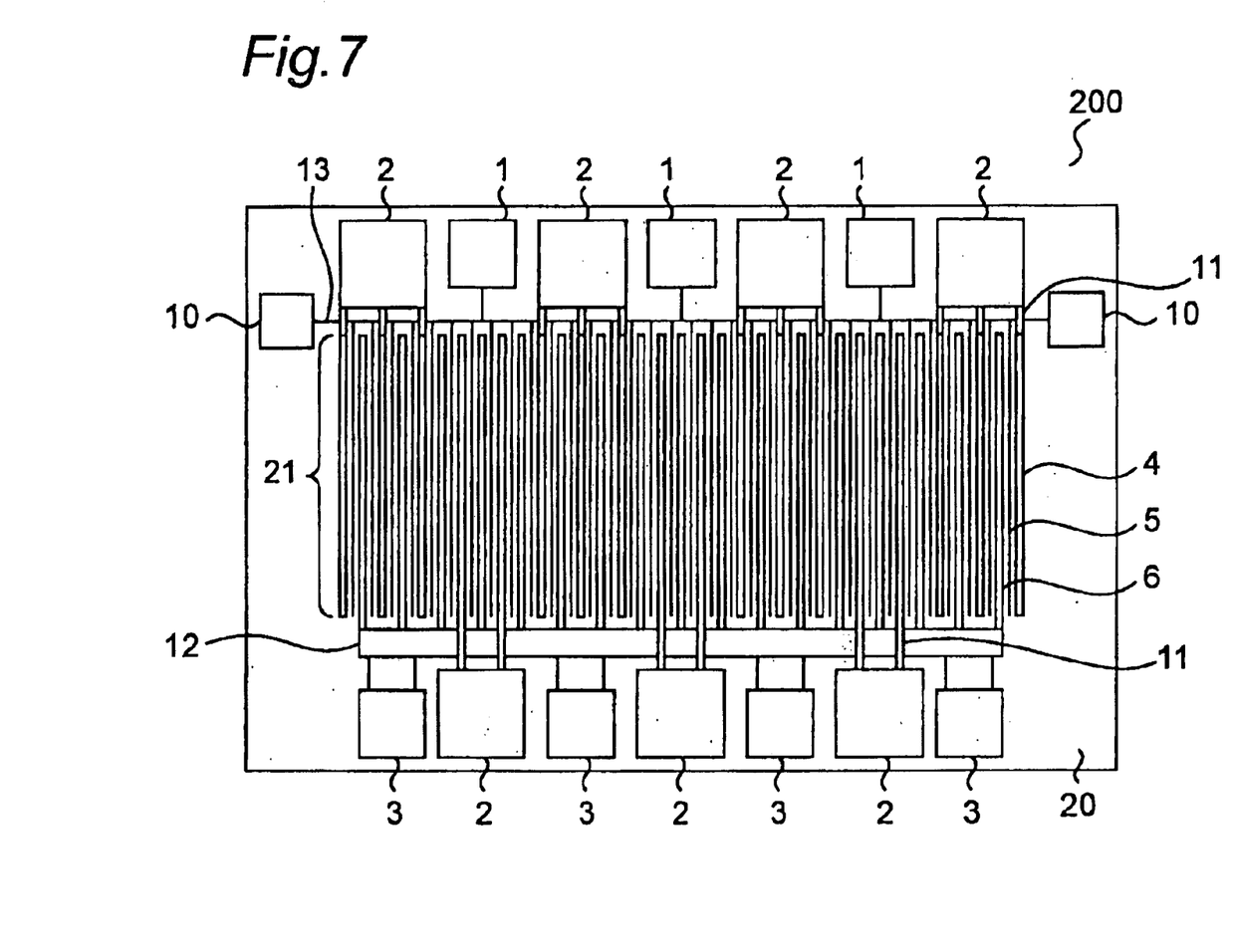
FIG. 7 is a top view of the semiconductor device according to the preferred embodiment 2 of the present invention.

FIG. 7 is a top view of a semiconductor device according to a preferred embodiment 2, which is generally denoted at 200. In FIG. 7, the same reference symbols as those in FIG. 1 denote the same or corresponding portions.

In the semiconductor device 100 described above, there are the source via holes 2 disposed on the both sides to the active region 21 such that the source via holes 2 face each other across the active region 21. In contrast, in the semiconductor device 200 according to the preferred embodiment 2, source via holes 2 are disposed facing gate pads 1 or drain pads 3 but not facing each other.

Use of such a structure shortens the lengths of source air bridges 11 which connect the source via holes 2 with source electrodes 4, decreases the source inductance Ls, and increases the maximum gain.

Since the horizontal width of the source electrodes connected with one source via hole 2 in particular is equal to or narrower than the horizontal width of the source via hole 2, it is possible to form the source air bridges 11 along the longitudinal direction of the source electrodes 4 (i.e., a source electrodes width direction), decrease the source inductance Ls of the semiconductor device 200, and increase the maximum gain.

Further, in the semiconductor device 200, there are more source electrodes 4 which are connected with the source via holes 2 which are adjacent to the gate pads 1 than source electrodes 4 which are connected with the source via holes 2 which are adjacent to the drain pads 3. More specifically, three source electrodes 4 are connected each with the source via holes 2 which are adjacent to the gate pads 1, whereas two source electrodes 4 are connected each with the source via holes 2 which are adjacent to the drain pads 3. Since a drain wire 12 carries a larger current than a gate wire 13 and is wider than the gate wire 13, the source air bridges 11 over the drain wire 12 are longer and have a parasitic inductance.

Since the semiconductor device 200 uses a smaller number of source air bridges 11 which are over the wide drain wire 12, the source inductance Ls is reduced and the maximum gain is increased.

While three source electrodes 4 are connected each with the upper-side source via holes 2 and two source electrodes 4 are connected each with the lower-side source via holes 2 in FIG. 7, the number of the source electrodes 4 connected with the source via holes 2 may be different from these.

Preferred Embodiment 3

Figure 8:
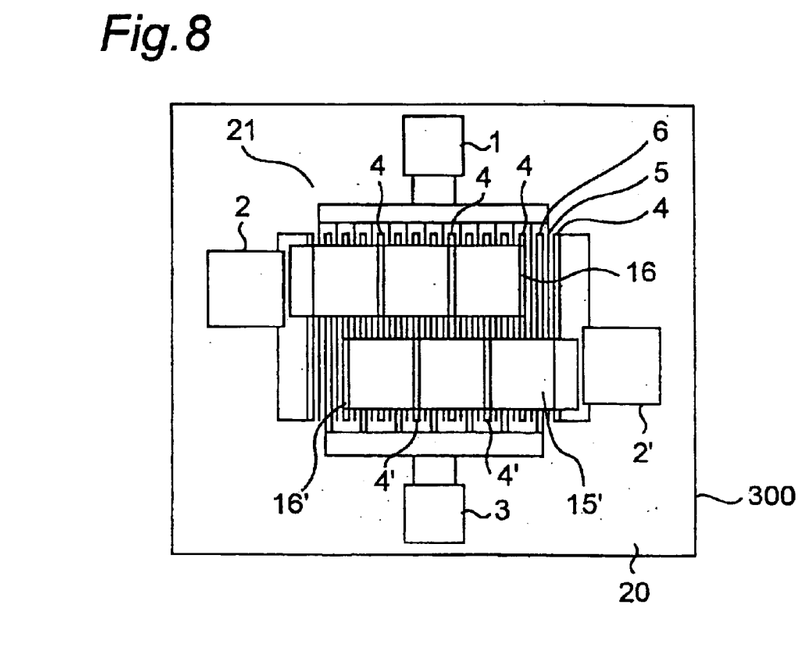
FIG. 8 is a top view of the semiconductor device according to the preferred embodiment 3 of the present invention.

FIG. 8 is a top view of a semiconductor device according to a preferred embodiment 3, which is generally denoted at 300. In FIG. 8, the same reference symbols as those in FIG. 1 denote the same or corresponding portions.

In the semiconductor device 300, there are a gate pad 1 and a drain pad 3 disposed such that the gate pad 1 and the drain pad 3 face each other across an active region 21. In addition, on the other sides of the active region 21, there are source via holes 2 and 2' disposed across the active region 21. On the active region 21, source electrodes 4 connected with the source via hole 2 and source electrodes 4' connected with the source via hole 2' are disposed alternately across drain electrodes 6. Air bridge electrodes 16 are disposed on the source electrodes 4 and connected with the source electrodes 4 by air bridge piers 15. In a similar manner, air bridge electrodes 16' are disposed on the source electrodes 4' and connected with the source electrodes 4' by air bridge piers 15'. As shown in FIG. 8, the air bridge electrodes 16 are disposed closer to the gate pad 1, while the air bridge electrodes 16' are disposed closer to the drain pad 3.

Having such a structure, the semiconductor device 300 ensures that currents flow in the opposite directions between the source electrodes 4 and the source electrodes 4'. Hence, with the source electrodes 4 and the source electrodes 4' disposed alternately, mutual inductances are offset. As a result, the source inductance Ls of the semiconductor device 300 is reduced and the maximum gain is increased.

Further, the left-hand side source via hole 2 is disposed above so that the left-hand side source via hole 2 is closer to the air bridge piers 15 and the right-hand side source via hole 2' is disposed below so that the right-hand side source via hole 2' is closer to the air bridge piers 15', and hence, distances between the side source via hole 2 and the air bridge piers 15 and distances between the side source via hole 2' and the air bridge piers 15' are short. As a result, the source inductance Ls becomes even smaller, which in turn further increases the maximum gain.

Preferred Embodiment 4

Figure 9:
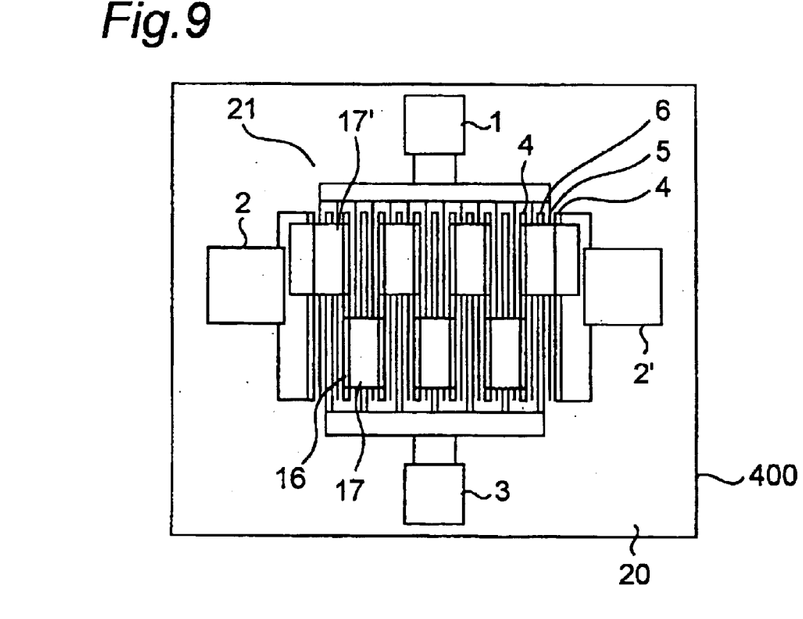
FIG. 9 is a top view of the semiconductor device according to the preferred embodiment 4 of the present invention.

FIG. 9 is a top view of a semiconductor device according to a preferred embodiment 4, which is generally denoted at 400. In FIG. 9, the same reference symbols as those in FIG. 1 denote the same or corresponding portions.

Except for structures of air bridge electrodes 17 which connect between the source electrodes 4, the semiconductor device 400 has a similar structure to that of the semiconductor device 300 described above.

In the semiconductor device 400, all source electrodes 4 are connected in series by the air bridge electrodes 17. The air bridge piers 15 connect between the air bridge electrodes 17 and the source electrodes 4.

As shown in FIG. 9, the air bridge electrodes 17 are disposed closer to a gate pad 1 and a drain pad 3 alternately. As a result, the directions of currents are opposite to each other between adjacent source electrodes 4.

Using such a structure, the semiconductor device 400 offsets mutual inductances between adjacent source electrodes 4. This reduces a source inductance Ls of the semiconductor device 300 and increases a maximum gain.

Although the preferred embodiments 3 and 4 are directed to the semiconductor devices 300 and 400 in which the source via holes 2 and 2' are disposed on the both sides of the active region 21, the plurality of semiconductor devices 300 and 400 may be disposed repeatedly along the vertical direction and the horizontal direction.

Preferred Embodiment 5

Figure 10:
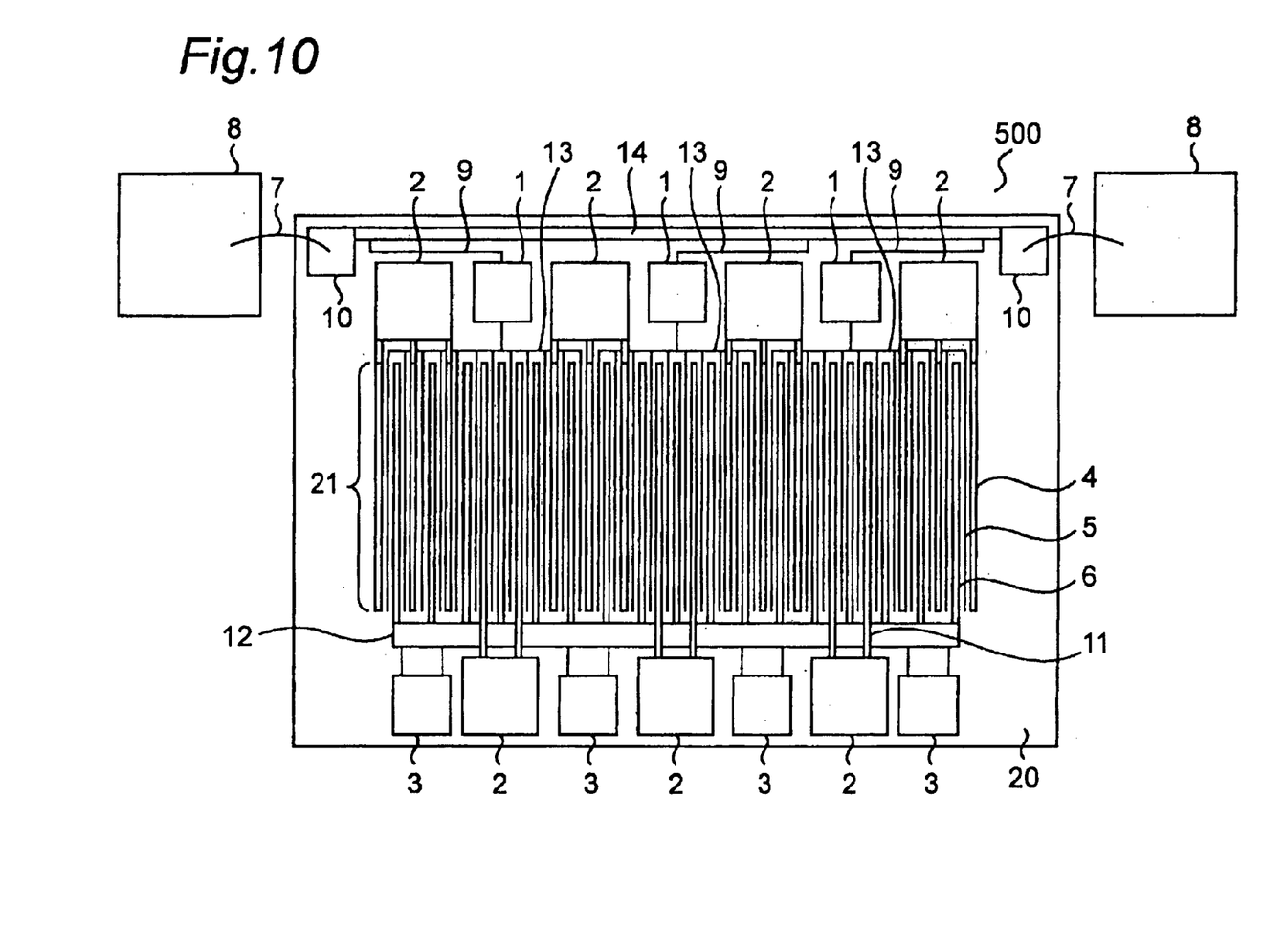
FIG. 10 is a top view of the semiconductor device according to the preferred embodiment 5 of the present invention.

FIG. 10 is a top view of a semiconductor device according to a preferred embodiment 5, which is generally denoted at 500. In FIG. 10, the same reference symbols as those in FIG. 1 denote the same or corresponding portions.

In the semiconductor device 500, instead of connecting all source electrodes 4 with one gate wire 13, source electrodes 4 are divided into a few groups and connected respectively with gate pads 1 which are connected with a gate wire 14. The gate pads 1 and the gate wire 14 are connected by resistor wires 9. Further, external connection pads 10 are connected with the gate wire 14, and by wires 7 of gold or the like, the external connection pads 10 are connected with a capacitor 8 which is disposed externally. Other structures are similar to those of the semiconductor device 200 according to the preferred embodiment 2 described earlier.

Figure 11:
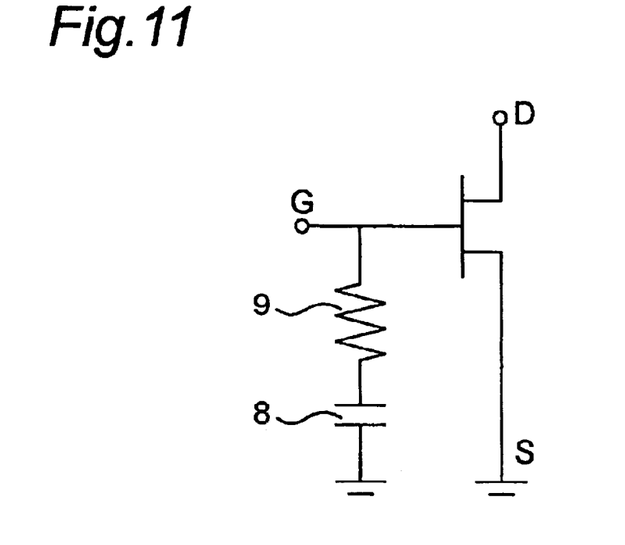
FIG. 11 shows the stabilizing circuit of the semiconductor device according to the preferred embodiment of the present invention.

In this structure, each gate pad 1 is connected with the gate wire 14 and a circuit structure as that shown in FIG. 11 is realized by a resistance (Rgs) and a capacitance (C), and therefore, the circuit is stable.

Figure 12:
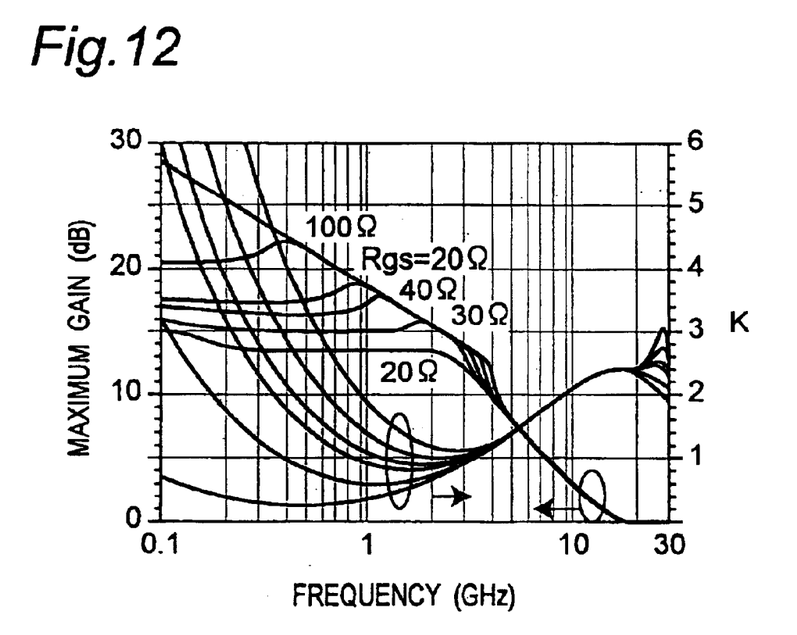
FIG. 12 shows a relationship between the frequency which is used, the maximum gain and the stability factor according to the preferred embodiment 5 of the present invention.

FIG. 12 shows how a frequency which is used, a maximum gain and a stability factor (k) relate to each other when the value of the resistance (Rgs) is varied from 20 to 30, 40, 50 and then to 60 ($\Omega$).

In FIG. 12, while Rgs is at 30 through 40$\Omega$, the stability factor k stays at 1 or higher at 1 GHz while maintaining a maximum gain which is obtained at 2 GHz. In other words, the maximum gain is reduced within a low-frequency range of 1 GHz or lower, and the circuit becomes therefore stable.

Further, since the semiconductor device 500 realizes stability at each gate pad, oscillation attributed to an internal loop between the gate pads 1, an internal loop between cells or the like is suppressed.

Unlike in a semiconductor device described in JP, 2001-44448, A, a capacitor is not provided for each cell in the semiconductor device 500 according to the preferred embodiment 5. When a capacitor is not provided for each cell on a semiconductor substrate of GaAs or other expensive material, the area sizes of the capacitors need be small due to a cost constraint, and therefore, the capacitances of the capacitors provided for the respective cells must be as small as about 10 pF or smaller. On the contrary, in the semiconductor device 500, these are connected with the gate wire 14 via the resistor wires 9 and then connected en masse with the capacitor 8. This permits to connect by means of a capacitor whose capacitance value is 100 pF or more. Hence, it is possible to stabilize the circuit even within a low-frequency range and prevent parasitic oscillation within the low-frequency range where a high gain is obtained.

While the resistor wires 9 are provided each for each gate pad 1 in the semiconductor device 500, the resistor wires 9 may be provided in other units. In addition, although the external connection pads 10 are disposed on the both sides, the external connection pads 10 may be disposed only on one side or only at one position at the center.

Further, while the external connection pads 10 are grounded via the external capacitor 8 in the semiconductor device 500, the external connection pads 10 may be grounded via an MIM capacitor which is formed on a semiconductor substrate 20.

What is claimed is:

1. A high power semiconductor device comprising:
    an active region having an approximately rectangular shape, located on a semiconductor substrate; and
    at least one cell including:
        a drain electrode extending across at least part of the active region;
        first and second source electrodes extending across at least part of the active region and disposed on opposite sides of the drain electrode, with the first and the second source electrodes facing each other;
        first and second gate electrodes extending across at least part of the active region and respectively interposed between the drain electrode and the first and second gate electrodes; and
        first and second source via holes located outside of and on opposite sides of the active region and respectively electrically connected to the first and second source electrodes so that currents carried by the first and the second source electrodes flow in opposite directions from each other.

2. The semiconductor device according to claim 1, including a plurality of the cells, wherein all of the source wires are connected to source via holes by air bridges which extend generally along a width direction of the source electrodes.

3. The semiconductor device according to claim 1, wherein the first source via hole is offset from a position which faces the second source via hole across the active region.

4. The semiconductor device according to claim 1, comprising a plurality of the cells, a gate pad disposed adjacent to the first source via hole, and a drain pad disposed adjacent to the second source via hole, wherein the source electrodes which are connected to the first source via hole outnumber the source electrodes which are connected to the second source via hole.

5. The semiconductor device according to claim 1, comprising a plurality of the cells and a plurality of gate wires to which any one of the gate electrodes is connected, wherein the gate wires are connected to a grounded capacitance via a resistor.

6. The semiconductor device according to claim 5, comprising an external connection pad which is connected to the resistor, wherein the external connection pad and the capacitance are connected by a wire.

7. The semiconductor device according to claim 1 including a plurality of the cells and a plurality of bridge wires connecting source electrodes which are adjacent to each other so that the plurality of source electrodes are connected in series.

8. A high power semiconductor device comprising:
    a plurality of source electrodes;
    an active region having an approximately rectangular shape, located on a semiconductor substrate;
    a plurality of source electrodes located on the active region;
    a drain electrode disposed such that the drain electrode faces the source electrodes across one of the gate electrodes; and
    a bridge wire disposed above the source electrodes and connecting the source electrodes to each other, wherein the source electrodes are connected with each other by the bridge wire so that currents carried by the source electrodes flow in directions alternately opposite to each other.

9. The semiconductor device according to claim 8, wherein the bridge wire includes first and second bridge wires, and the source electrodes connected with the first bridge wire and the source electrodes connected with the second bridge wire are disposed alternately.

10. The semiconductor device according to claim 8, wherein the bridge wire includes a plurality of bridge wires connecting the source electrodes which are adjacent to each other so that the plurality of source electrodes are connected in series.

11. The semiconductor device according to claim 8, comprising a plurality of gate wires to which any one of the plurality of gate electrodes is connected, wherein the gate wires are connected to a grounded capacitance via a resistor.

12. The semiconductor device according to claim 11, comprising an external connection pad which is connected to the resistor, wherein the external connection pad and the capacitance are connected by a wire.

13. A high power semiconductor device comprising:

an active region having an approximately rectangular shape, located on a semiconductor substrate;

the plurality of drain electrodes extending across at least part of the active region;

a plurality of gate electrodes extending across at least part of the active region;

a plurality of source electrodes extending across at least part of the active region, each pair of source electrodes being disposed on opposite sides of one of the drain electrodes with respective gate electrodes interposed between the drain electrode and the source electrodes of the pair of source electrodes;

a plurality of source via holes located on the semiconductor substrate outside of and on opposite sides of the active region; and a plurality of bridge wires disposed above the drain electrodes and connecting respective groups of the source electrodes to each other and to one of the source via holes so that currents carried by the respective groups of source electrodes flow in opposite directions from each other.

14. The semiconductor device according to claim 13 wherein the bridge wires extend along a width direction of the source electrodes connected to the bridge wires.

15. The semiconductor device according to claim 13, wherein the source via holes on opposite sides of the active region are not directly opposite each other but are offset relative to a direction along the source and drain electrodes extend on the active region.

16. The semiconductor device according to claim 13, comprising a plurality of gate wires to which any one of the gate electrodes is connected, wherein the gate wires are connected to a grounded capacitance via a resistor.

17. The semiconductor device according to claim 16, comprising an external connection pad which is connected to the resistor, wherein the external connection pad and the capacitance are connected by a wire.

* * * * *